United States Patent
Lembeye

(10) Patent No.: US 9,923,526 B1
(45) Date of Patent: Mar. 20, 2018

(54) HARMONIC FILTER FOR RF AMPLIFIER

(71) Applicant: NXP USA, INC., Austin, TX (US)

(72) Inventor: Olivier Lembeye, Saint Lys (FR)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/451,811

(22) Filed: Mar. 7, 2017

(30) Foreign Application Priority Data

Feb. 13, 2017 (EP) .................... 17305160

(51) Int. Cl.
*H03F 3/191* (2006.01)
*H03F 1/56* (2006.01)
*H03F 3/195* (2006.01)
*H03F 3/213* (2006.01)

(52) U.S. Cl.
CPC .............. *H03F 1/56* (2013.01); *H03F 3/195* (2013.01); *H03F 3/213* (2013.01); *H03F 2200/222* (2013.01); *H03F 2200/225* (2013.01); *H03F 2200/387* (2013.01); *H03F 2200/451* (2013.01)

(58) Field of Classification Search
CPC .................................. H03F 3/191; H03F 3/16
USPC ......................................... 330/302, 305, 277
See application file for complete search history.

(56) References Cited

U.S. PATENT DOCUMENTS

| | | | |
|---|---|---|---|
| 4,406,991 A | 9/1983 | Strycula et al. | |
| 4,433,315 A | 2/1984 | Vandegraaf | |
| 5,095,285 A | 3/1992 | Khatibzadeh | |
| 5,260,862 A | 11/1993 | Marsh | |
| 6,236,274 B1 | 5/2001 | Liu | |
| 7,612,616 B2* | 11/2009 | Deng | H03F 1/0205 330/253 |
| 7,741,907 B2* | 6/2010 | Takagi | H03F 3/217 330/251 |
| 8,076,994 B2 | 12/2011 | Farrell et al. | |
| 8,659,359 B2* | 2/2014 | Ladhani | H03F 1/0288 330/302 |
| 2003/0214366 A1 | 11/2003 | Robison et al. | |
| 2008/0094141 A1 | 4/2008 | Gotou et al. | |
| 2010/0026393 A1 | 2/2010 | Keerti et al. | |
| 2010/0079211 A1 | 4/2010 | Matsuda et al. | |

(Continued)

FOREIGN PATENT DOCUMENTS

| | | |
|---|---|---|
| EP | 0612142 A2 | 8/1994 |
| EP | 2106023 A1 | 9/2009 |
| GB | 2017444 A | 10/1979 |

OTHER PUBLICATIONS

EP Application No. 16306079.1 entitled "Power Transistor with Harmonic Control", filed on Aug. 24, 2016.

*Primary Examiner* — Henry Choe
(74) *Attorney, Agent, or Firm* — David G. Dolezal

(57) ABSTRACT

An RF amplifier includes a harmonic filter with a plurality of shunt filter legs. The harmonic filter provides a suppressing frequency range for a harmonic frequency of a carrier frequency in a range of carrier frequencies. Each of the shunt filter legs includes capacitor, inductor, and a node coupled between the capacitor and inductor. Each node of the shunt filter leg is coupled to at least one other node of another shunt filter leg of the filter with a resistive element. The harmonic filter includes a first shunt filter leg that has a resonant frequency between the center frequency and (1/1.220) times the center frequency and a second shunt filter leg that has a resonant frequency between the center frequency and 1.220 times the center frequency.

20 Claims, 4 Drawing Sheets

(56) References Cited

U.S. PATENT DOCUMENTS

| | | |
|---|---|---|
| 2011/0133853 A1 | 6/2011 | Harima et al. |
| 2011/0187448 A1 | 8/2011 | Koechlin |
| 2017/0040958 A1 | 2/2017 | Cao et al. |

* cited by examiner

HARMONIC FILTER FOR RF AMPLIFIER

CROSS-REFERENCE TO RELATED APPLICATIONS

This application claims the priority under 35 U.S.C. § 119 of European Patent application no. 17305160.8, filed on 13 Feb. 2017, the contents of which are incorporated by reference herein.

BACKGROUND OF THE INVENTION

Field of the Invention

This invention relates to RF amplifiers and more specifically to harmonic filters for RF amplifiers.

Description of the Related Art

RF amplifiers utilize harmonic filters to block harmonic frequencies (e.g. the 2nd harmonic frequency) of the fundamental carrier frequency.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, an RF amplifier includes a harmonic filter with a plurality of shunt filter legs. The harmonic filter provides a suppressing frequency range for a harmonic frequency of a carrier frequency in a range of carrier frequencies. Each of the shunt filter legs includes a capacitor, an inductor, and a node coupled between the capacitor and inductor. Each node of the shunt filter leg is coupled to at least one other node of another shunt filter leg of the filter with a resistive element. The filter provides a suppressing frequency range for a harmonic (e.g. 2nd harmonic) of a carrier frequency in a range of carrier frequencies. The suppression frequency range has a center frequency. The harmonic filter includes a first shunt filter leg that has a resonant frequency that is less than the center frequency but is (1/1.220) times the center frequency or greater, and a second shunt filter leg that has a resonant frequency that is greater than the center frequency but is 1.220 times the center frequency or less. The resistors provide a dampening function to equalize the response of the harmonic filter across the suppression frequency range to provide for a smoother response across the entire range. Proving such a filter in one embodiment may also provide for a harmonic suppression range that is wider than with a harmonic filter having only one shunt filter or shunt filters located in parallel without the resistors.

Figure 1:
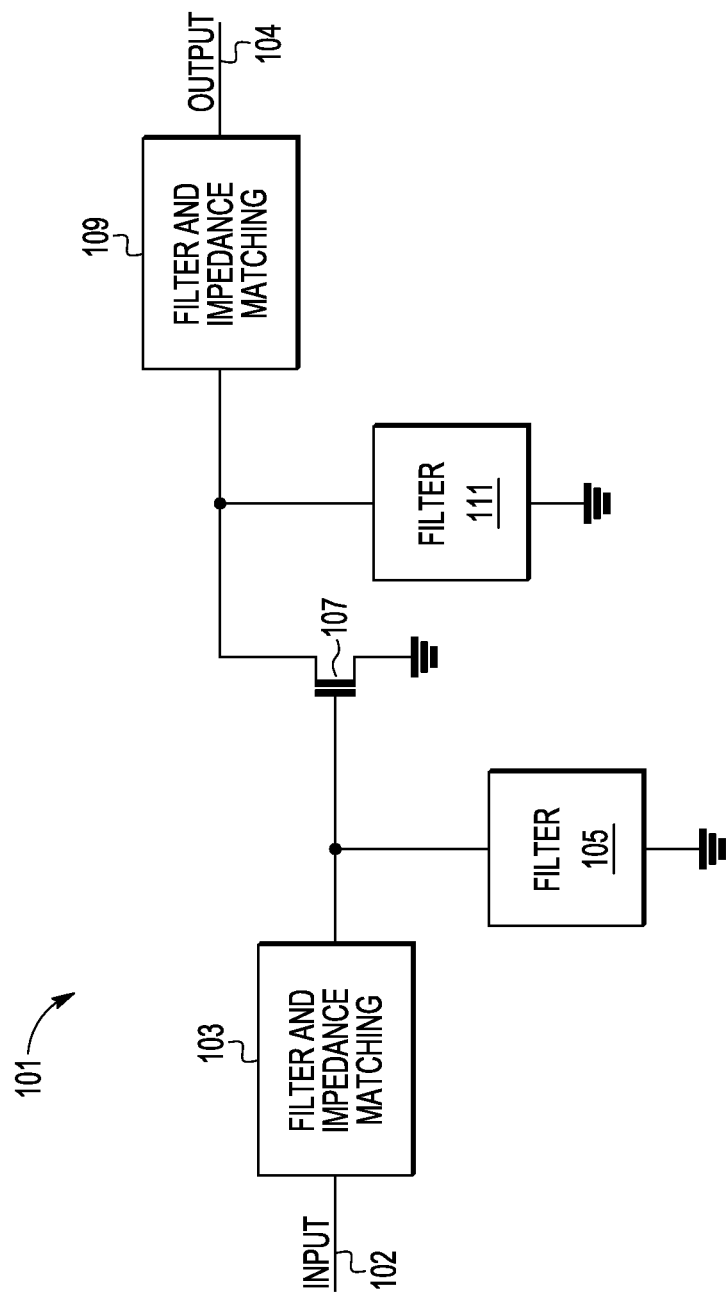
FIG. 1 is a circuit diagram of an RF amplifier according to one embodiment of the present invention.

FIG. 1 shows a circuit diagram of an RF amplifier 101 according to one embodiment of the present invention. RF amplifier 101 includes an input 102 to receive a lower power signal that is typically modulated at a carrier frequency and an output 104 that provides an amplified version of the signal that is amplified to increase the power of the input signal. Amplifier 101 includes transistor device 107 that provides amplification of the signal. In one embodiment, transistor device 107 is implemented with a single transistor with a control terminal (e.g. gate) coupled to receive the input signal and two current terminals (e.g. a source and drain). One of the current terminals (e.g. the drain) is configured to provide the output signal. The other current terminal (e.g. the source) is coupled to ground. In other embodiments, transistor device 107 may be implemented with multiple transistors connected in parallel. In one embodiment, the transistors are characterized as laterally diffused MOSFETS, but may be characterized as bipolar transistors, MESFET transistors, HBT transistors, or HEMT transistors. In one embodiment, the transistors can include silicon such as with an LDMOS or bipolar transistor, a III-V material such GaAs as in a GaAs MESFET, InGaP as with a HBT, or GaN as with a HEMT or bipolar transistor.

In some embodiments, an information signal to be transmitted with the input signal may be modulated at the carrier frequency such as with a power amplifier for a cellular transmitter. In other embodiments, no information is modulated within the carrier frequency (as with a microwave heater device). In one embodiment, the carrier frequency is in the range of 500 MHz to 7500 MHz. For example, the carrier frequency is in the range of 1800 MHz-2200 MHz or in the range of 2300 MHz-2700 MHz. However, in other embodiments, the carrier frequency may be at other frequencies including at even higher frequencies such as at 77 GHz.

Amplifier 101 includes a number of filters configured to block out or reject unwanted frequencies. Filter 103 is an in-line filter designed to block out frequencies outside a desired frequency band prior to amplification. Filter 103 may also perform input impedance matching. Filter 109 blocks unwanted frequencies and provides output impedance matching of the output signal.

Amplifier 101 includes two harmonic blocking filters 105 and 111. Filter 105 is coupled to the gate of transistor device 107 and filter 109 is coupled to the drain of transistor device 107. These filters are configured to block or reject harmonic frequencies (e.g. the second harmonic frequency) of the carrier frequency for a range of carrier frequencies by providing a harmonic short to ground for those frequencies. As will be described layer, the filters 105 and 111 each include multiple shunt legs having nodes coupled to one another by dampening resistors.

Although, amplifier 101 is shown having two in line filters 103 and 109 and two harmonic blocking filters 105 and 111, other amplifiers in other embodiments may have other configurations. For example, an amplifier may include multiple harmonic filters, each for blocking a different harmonic (e.g. second, third, fourth).

Figure 2:
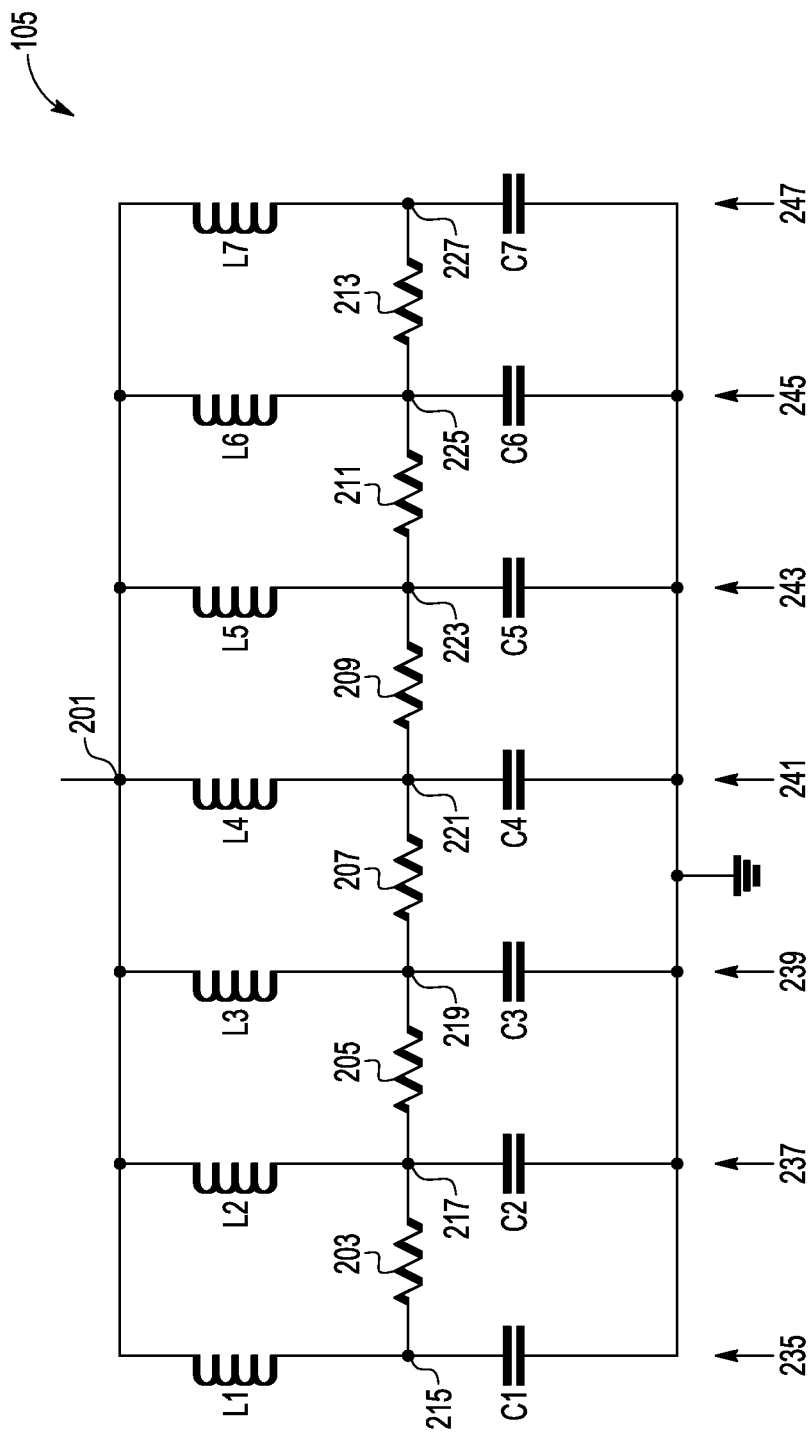
FIG. 2 is a circuit diagram of a harmonic filter according to one embodiment of the present invention.

FIG. 2 is a circuit diagram of harmonic blocking filter 105 according to one embodiment. Filter 111 may have a similar configuration. Filter 105 is shown with 7 shunt filter legs (235, 237, 239, 241, 243, 245, and 247). Each shunt filter leg includes an inductor (L) and a capacitor (C) coupled between an input node (201) and ground node. Input node 201 is coupled to the gate of transistor device 107 and filter 103. The inductor (L) and capacitor (C) of each leg is tuned to a different resonant frequency that by itself, would provide a short to ground at that frequency. The resonant frequency of a shunt filter leg is equal to 1/(2*pi*square root of (LC)), where L is the inductance value and C is the capacitance value of shunt filter leg.

In the embodiment shown, filter 105 includes 7 legs. Leg 241 is tuned to a center frequency (CF) of the filter (e.g. 5.2 GHz). The other legs are tuned to different resonance frequencies on either side of the center frequency (CF). As used herein, the "center frequency" of a filter refers to the logarithmic center frequency of a filter. In some embodiments, the resonant frequency of each leg is uniformly logarithmically spaced from the adjacent resonant frequency of the other legs by a spacing factor (X). For example, a lower adjacent resonant frequency is spaced apart from a higher adjacent resonant frequency by (1−(1/1+X)) times the higher adjacent resonant frequency. Or stated another way, a higher adjacent resonant frequency is spaced apart from a lower adjacent resonant frequency by X times the lower adjacent resonant frequency. Accordingly, for a filter with 7 shunt filter legs with the middle leg having a resonant frequency of CF, the resonant frequencies of the 7 legs would be from lowest to highest: (1/1+X)(1/1+X)(1/1+X)CF; (1/1+X)(1/1+X)CF; (1/1+X)CF; CF; (1+X)CF; (1+X)(1+X)CF; and (1+X)(1+X)(1+X)CF. For example, if the spacing factor was 0.12 for filter 105, then the seven frequencies would be: 0.71 CF, 0.80 CF, 0.89 CF, CF, 1.12 CF, 1.25 CF, and 1.40 CF (rounded to the nearest one hundredth) for legs 235, 237, 239, 241, 243, 245, and 247, respectively. In some embodiments, the spacing factor has a value: 0.4>X>0.

In other embodiments, filter 105 may have a different number of filter legs, (2 or more (e.g. 15)). In still other embodiments, the spacings of the resonant frequencies of the legs may be non-uniform. For example, leg 235 may have a resonant frequency of 0.65 CF leg 237 may have a resonant frequency of 0.8 CF, and leg 239 may have a resonant frequency of 0.93 CF. In some embodiments, Leg 241 may be tuned to a different resonant frequency than CF. In one embodiment, the filter may include legs tuned at resonant frequencies less than (1/1.220)CF or greater than 1.220 CF. However, most embodiments will include at least one leg that is tuned to a resonant frequency that is less than CF but is greater than or equal to (1/1.220)CF and one leg that is tuned to a resonant frequency that is greater than CF but less than or equal to 1.220 CF. In some embodiments, a filter may have more legs tuned to resonant frequencies above CF than below CF or vice versa.

Filter 105 includes dampening resistors 203, 205, 207, 209, 211, and 213, that are coupled between the nodes 215, 217, 219, 221, 223, 225, and 227 of the legs of filter 105. These resistors act to dampen or reduce the quality factor of the shunt filter leg to shunt filter leg resonance in order equalize the response of filter 105 across the entire suppressing frequency range of the filter. These resistors dampen the anti-resonance inherent to coupled shunt filters of different resonant frequencies. In some embodiments, a wider bandwidth is achieved than with a filter circuit without the damping resistors.

In one embodiment where filter 105 has an at least −29 dB of rejection at each frequency across a frequency range from 4.295 GHz to 6.295 GHz, leg 235 is tuned to a resonant frequency of 4.444 GHz, leg 237 is tuned to a resonant frequency of 4.683 GHz, leg 239 is tuned to a resonant frequency of 4.935 GHz, leg 211 is tuned to a resonant frequency of 5.2 GHz, leg 243 is tuned to a resonant frequency of 5.479 GHz, leg 245 is tuned to a resonant frequency of 5.774 GHz, and leg 247 is tuned to a resonant frequency of 6.084 GHz. In one implementation of this embodiment, capacitors C1, C2, C3, C4, C5, C6, and C7 have capacitance values of 1.35 pF, 1.18 pF, 1.21 pF, 1.15 pF, 1.09 pF, 1.04 pF, and 0.98 pF respectively and inductors L1, L2, L3, L4, L5, L6, and L7 have inductance values of 0.95 nH, 0.9 nH, 0.86 nH, 0.81 nH, 0.77 nH, 0.73 nH, and 0.7 nH respectively. In another implementation, the same resonant frequencies given above may be obtained by inductors L1-L7 all having the same inductance value and the capacitors C1-C7 being of different values than given above. Resistors 201, 203, 205, 207, 209, 211, and 213 have a resistive value of 500 Ohm. Such a filter provides a 2nd harmonic rejection for a carrier frequency range from 2.147 GHz to 3.147 GHz. However, these may be of other values in other embodiments.

Figure 3:
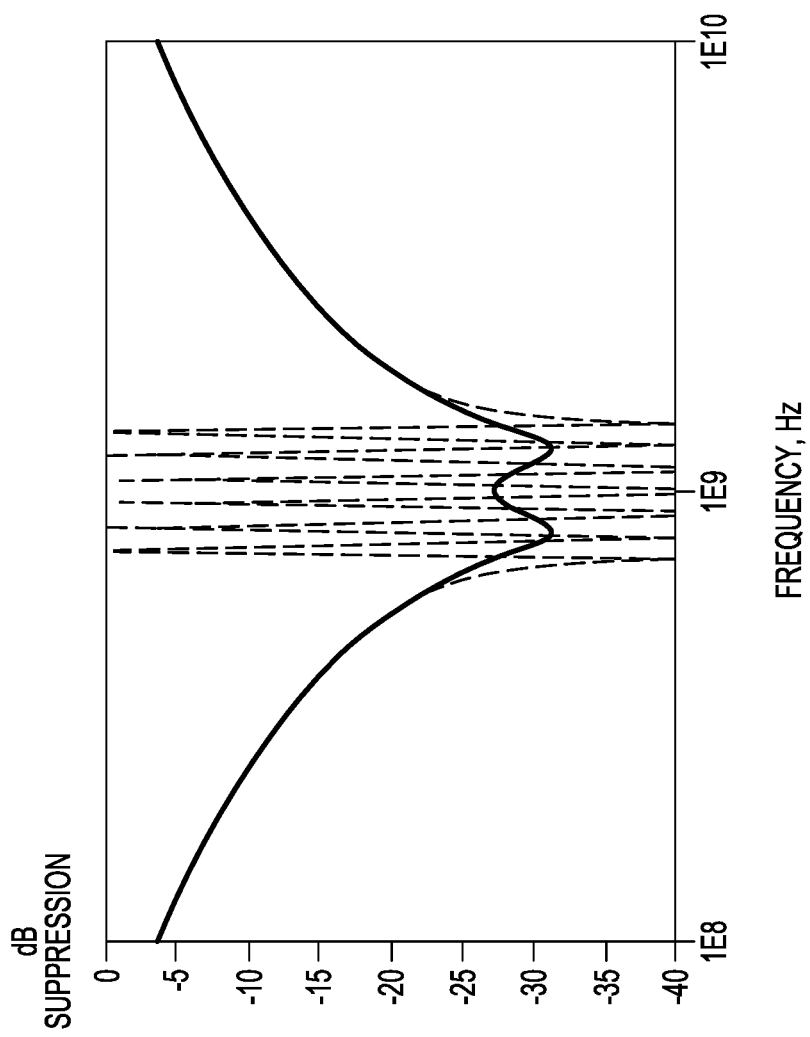
FIG. 3 is a graph showing the suppression response of a harmonic filter according to one embodiment of the present invention.

FIG. 3 shows an example of the effect of the dampening resistors to a suppression response of a harmonic filter according to one embodiment of the present invention. In FIG. 3, the solid line shows the suppression response of a filter (105) with dampening resistors (e.g. 203) and the dashed line shows the suppression response of a similar filter without dampening resistors. Each filter includes 7 shunt legs with each shut leg being tuned to a different resonant frequency from the other shunt legs. The resonant frequencies of the legs for both filters are the frequencies at which the dashed lines indicate a −40 db of rejection of the frequency. The solid line shows the suppression response of a filter similar to filter 105 where dampening resistors (e.g. 203) couple the nodes of the legs of the filter together.

As shown in FIG. 3, the filter without the dampening resistors has a greater suppression response at the 7 resonant frequencies, but the suppression response across the range is uneven (e.g. from −40 dB to near 0 dB).

On the other hand, the solid line shows that the dampening resistors act to "smooth out" the suppression response of the shunt filter legs at locations between the resonant frequencies. As shown in the particular embodiment, the filter with dampening resisters provides at least a −25 dB of rejection across the suppression range in a 50 ohm measurement system. In other embodiments, a filter may provide a greater or lesser amount of −dB of rejection across the suppression range. In one embodiment, filter 105 may provide −20 dB of rejection for a suppression range (depending upon the number of legs and the resonant frequency spacing of the legs). A −20 dB of rejection corresponds to 2.78 ohm shunt impedance, a −28.3 dB of rejection corresponds to 1 ohm shunt impedance, and a −30 dB of rejection corresponds to 0.82 ohm shunt impedance.

In some embodiments, the suppression range of the filter can be characterized as having a high frequency end=1.Y*CF and a low frequency end=(1/1.Y)*CF, where Y is a variable. In one embodiment where Y=40, the suppression range would be −25 dB of rejection or greater across the range.

In the embodiment shown, the center leg has a resonant frequency of 1 GHz. Each resonant frequency is space apart from a higher adjacent resonant frequency by (1−(1/1.12)) times the higher adjacent resonant frequency. In the embodiment shown, the −25 dB (50 ohm) suppression range of the filter is 0.653 GHz to 1.531 GHz. As shown in FIG. 3, all of the resonant frequencies of the legs are located in the −25 dB of suppression range of the filter. In other embodiments, the center frequency would be of other values (e.g. in a range of 3.6 to 6.0 GHz).

Because the dampening resistors act to "smooth out" the suppression response of a filter across a range of frequencies, the filter effectively suppresses the desired harmonic of a carrier frequency within the range of carrier frequencies. For example, if the −25 dB (50 ohm) suppression range is from 0.653 GHz to 1.531 GHz as shown in FIG. 3, the filter can be used to suppress the second harmonic for a carrier frequency in the range of 0.326 GHz to 0.765 GHz. Accordingly, in some embodiments, providing a harmonic filter with dampening resistors acts to increase the effective suppressing range of the harmonic filter without having to employ active bandwidth adjustment features (e.g. variable inductors, switched capacitors, or other switches) in to accommodate for the different carrier frequencies in a corresponding range of carrier frequencies.

In some embodiments, the center frequency and the effective suppression range of a filter are dependent on the resonant frequencies of the filter legs, the spacings of the resonant frequencies of the filter legs, and the number of legs. For example, for a 7 leg filter with a spacing factor of 0.06, a −30 dB, 50 ohm suppression frequency range of 0.782 GHz to 1.279 GHz can suppress a second harmonic of a carrier frequency range of 0.391 GHz to 0.639 GHz. In another example of a 7 leg filter with a 0.03 spacing factor, a −35 dB, 50 ohm suppression frequency range of 0.875 GHz to 1.143 GHz can suppress a second harmonic of a carrier frequency range of 0.438 GHz to 0.571 GHz.

In the example shown, the resistor values are approximately 17 ohm, but may be of other values in other embodiments. Lower resistor values would smooth out the suppressing response within the suppressing range but would reduce the suppression range of the filter. Higher resistance values lower the suppression level at different frequencies in the range but makes the suppression levels more uneven over the range. In some instances, higher resistance values may widen the suppression range of the filter. In one embodiment, the resistive values are in a range of 10 to 10K ohms, but may be of other values in other embodiments.

Figure 4:
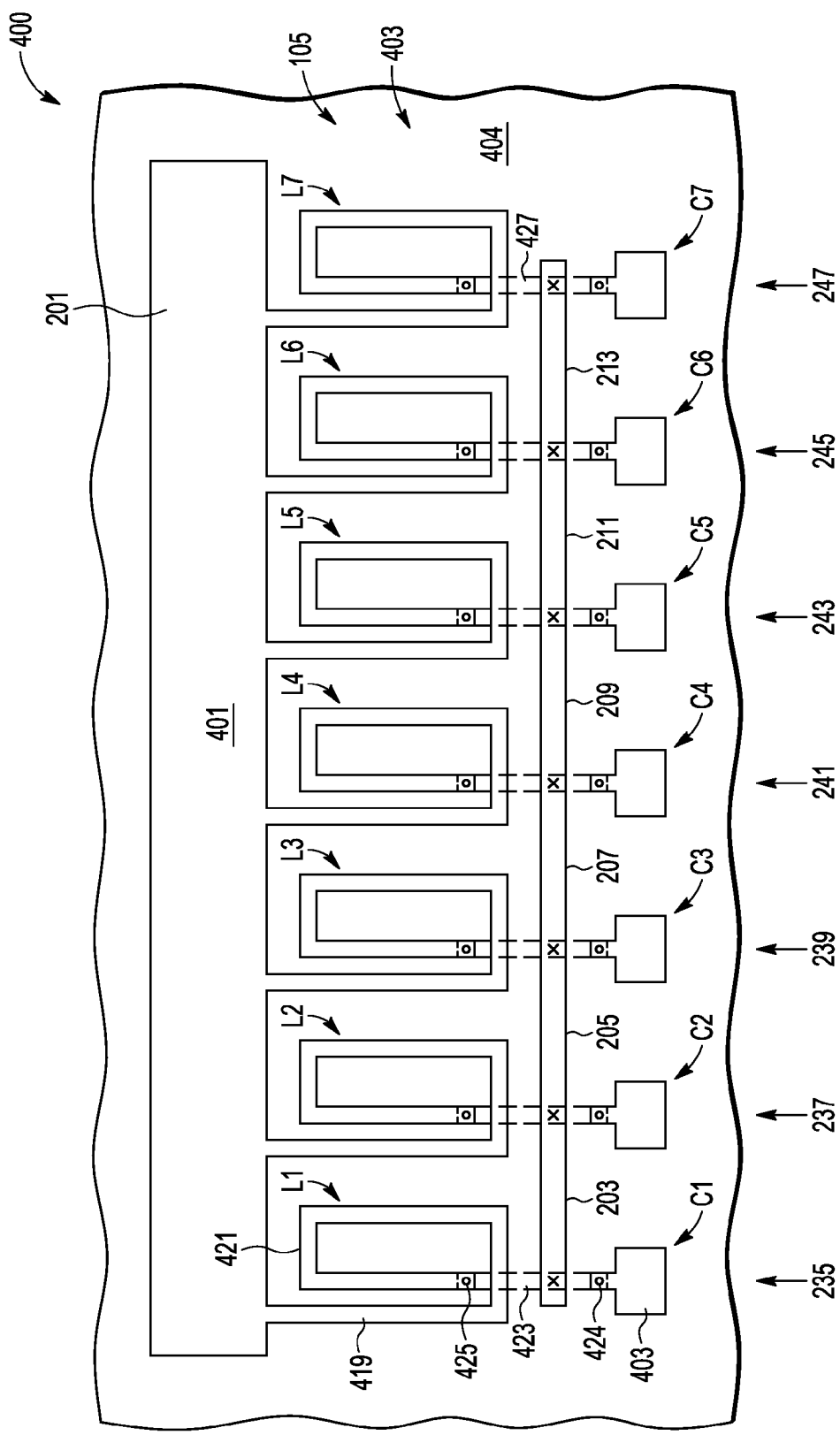
FIG. 4 is a partial top view of a harmonic filter according to one embodiment of the present invention.

FIG. 4 is a partial top view of filter 105 according to one embodiment of the present invention. Filter 105 is implemented in a substrate 403. In one embodiment, substrate 403 includes a base layer (not shown) of a high resistive silicon material, but may be of other materials such as a dielectric material (e.g. oxide, resin, glass) in other embodiments.

In the embodiment shown, node 201 is implemented as a metal plate 401 located on a dielectric layer 404 of substrate 403. Layer 404 is located over the base layer of high resistive silicon material. In one embodiment, plate 401 is made by patterning a copper layer that initially covers layer 404. However, plate 401 may be of other materials and/or made by other methods in other embodiments. The inductors (L1-L7) are formed by metal traces (e.g. 419) formed from the same layer as plate 401 and extend from plate 401 to form loop patterns (e.g. 421). The amount of inductance provided by an inductor is dependent upon the size and shape of the loop pattern. Each loop pattern (e.g. 421) is coupled to a resistor and a capacitor by a bridge piece (e.g. 423 shown in dashed lines) which in the embodiment shown, is formed from a second metal layer (not shown) located below layer 404. The bridge pieces are electrically coupled to structures above by conductive vias (e.g. 424, 425) in a dielectric layer 404.

In the embodiment shown, resistors 203, 205, 207, 209, 211, and 213 are implemented in a strip 427 of resistive material. In one embodiment, strip 427 is a layer of poly silicon that is doped to provide the desired resistivity per length between two adjacent bridge structures (423) of two adjacent legs. In one embodiment, strip 427 is located in an opening of layer 404 and is on and is in electrical contact (as designated by the "x" at their crossing) with the bridge pieces (423). In other embodiments, the resistors may be made of other materials such as tungsten silicide. In still other embodiments, the resistors can be formed by doping a portion of the high resistive silicon base layer (not shown) with conductivity dopants to make those areas less resistive.

The top electrodes of capacitors (C1-C7) are implemented by plates (e.g. 403) formed on the surface of dielectric layer 404 from the top metal layer. The plates (403) are coupled to the bridge pieces (423) by vias (424). The bottom electrodes (not shown) are located in the bottom metal layer of the bridge pieces (423). The bottom electrodes are coupled to a backside ground plate (not shown) located on the backside of substrate 403 by conductive vias (not shown). In one embodiment, the size of the capacitors (C) can be adjusted by varying the area of the plates (e.g. 403). In other embodiments, a filter may have other structures, other configurations, and/or be formed of other materials.

In the embodiment shown, the resonant frequencies of each shunt leg 235, 237, 239, 241, 243, 245, and 247 increase from left to right in the view shown in FIG. 4. However, in other embodiments, the resonant frequencies would decrease from left to right. In still other embodiments, the resonant frequencies would be mixed. In some embodiments, the inductors (L) of each leg are of the same size and the capacitors (C) of each leg are of different sizes. In other embodiments, the capacitors (C) of each leg are the same size and the inductors (L) are of different sizes. In other embodiments, both the capacitors (C) and inductors (L) are varied to provide the different resonant frequencies.

In some embodiments, multiple wirebonds (not shown) are attached to plate 401 and are attached to the gate terminal contact (not shown) of a transistor die (not shown) that includes transistor device 107. Plate 401 is also wirebonded to the circuitry of filter 103. In some embodiments, filter 103 is implemented on substrate 403, where the output of filter 103 is a metal trace that extends to plate 301. Also, filters 109 and 111 may be located on substrate 403 as well. In other embodiments, some or all of filters 103, 111, and 109 may be located on other dies. In other embodiments, transistor device 107 may be implemented on substrate 403. The substrates, transistor devices, and wirebonds may be encapsulated with encapsulant to form an integrated circuit package (not shown) with external connectors (e.g. leads) extending from the package. In some embodiments, the amplifier may be integrated in the same package with other circuitry (e.g. processing circuitry).

A RF amplifier package may have other configurations in other embodiments. For example, in some embodiments, plate 401 is omitted wherein each inductor is wirebonded to a gate (not shown) of a transistor of transistor device 107. The gates of the transistors of the transistor device 107 would be coupled together at the transistor device. In some embodiments, the lengths of the wirebonds would be varied to adjust the inductances of each leg.

In other embodiments, the positions of the capacitor and inductor in each shunt leg are interchanged to where the inductors are connected to the ground terminal and the capacitors are connected to node 201. Also in other embodiments, each shunt leg is coupled in parallel to another power supply terminal other than ground. For example, in some embodiments, each leg is coupled to a VDD terminal.

In one embodiment, An RF amplifier includes a transistor device, an input to receive an input signal having a carrier frequency, an output to provide an amplified signal of the input signal, and a harmonic filter coupled to a terminal of the transistor device. The harmonic filter includes a filter input and a plurality of shunt filter legs. Each shunt filter leg of the plurality includes a first terminal coupled to the filter input and a second terminal coupled a power supply terminal. Each shunt filter leg of the plurality includes an inductor and a capacitor. The capacitor and the inductor are located in series between the first terminal and a second terminal. Each shunt filter leg of the plurality includes a node coupled between the inductor and capacitor. Each shunt filter leg of the plurality of shunt filter legs is tuned to resonant frequency of a plurality of resonant frequencies. The resonant frequency of the shunt filter leg is different from the resonant frequencies of other shunt filter legs of the plurality. The harmonic filter includes a set of at least one resistive element. Each resistive element of the set is coupled between the nodes of two different shunt filter legs of the plurality of shunt filter legs to provide a resistive path between the nodes of the two different shunt filter legs. The harmonic filter provides a suppressing frequency range for a harmonic of a carrier frequency in a range of carrier frequencies. The suppressing frequency range includes a center frequency. A first leg of the plurality of shunt filter legs is tuned to a first resonant frequency that is less than the center frequency but is (1/1.220) times the center frequency or greater. The plurality of shunt filter legs includes second leg that is tuned to a second resonant frequency that is greater than the center frequency but is 1.220 times the center frequency or less.

In another embodiment, a method of operating an RF amplifier includes providing an input signal to an RF amplifier. The input signal includes a carrier frequency. In another embodiment, the method includes suppressing a harmonic of the carrier frequency with a filter. The filter includes a plurality of shunt legs located in parallel and coupled to a power supply terminal. Each shunt leg of the plurality includes a capacitor and an inductor located in series with a node located between the capacitor and the inductor. Each shunt leg of the plurality is tuned to a resonant frequency of a plurality of resonant frequencies. The filter provides a suppression range. A first leg of the plurality of shunt legs is tuned to a first resonant frequency of the plurality of resonant frequencies that is less than a center frequency (CF) of the suppression range and greater than or equal to (1/1.220) times the center frequency. A second leg of the plurality is tuned to a second resonant frequency of the plurality of resonant frequencies that is greater than the center frequency and is less than or equal to 1.220 times the center frequency. The filter includes a set of at least one resistive element. Each resistive element of the set is coupled between the nodes of two different shunt filter legs of the plurality of shunt filter legs to provide a resistive path between the nodes of the two different shunt filter legs. The method includes amplifying the input signal with a transistor device.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. An RF amplifier comprising:
   a transistor device;
   an input to receive an input signal having a carrier frequency;
   an output to provide an amplified signal of the input signal;
   a harmonic filter coupled to a terminal of the transistor device; the harmonic filter including:
      a filter input;
      a plurality of shunt filter legs, each shunt filter leg of the plurality includes:
         a first terminal coupled to the filter input and a second terminal coupled a power supply terminal;
         an inductor;
         a capacitor, the capacitor and the inductor are located in series between the first terminal and the second terminal;
         a node coupled between the inductor and capacitor;
         wherein each shunt filter leg of the plurality of shunt filter legs is tuned to resonant frequency of a plurality of resonant frequencies, wherein the resonant frequency of the shunt filter leg is different from the resonant frequencies of other shunt filter legs of the plurality;
      a set of at least one resistive element, each resistive element of the set is coupled between the nodes of two different shunt filter legs of the plurality of shunt filter legs to provide a resistive path between the nodes of the two different shunt filter legs;
      wherein the harmonic filter provides a suppressing frequency range for a harmonic of a carrier frequency in a range of carrier frequencies;
      wherein the suppressing frequency range includes a center frequency;
      wherein a first leg of the plurality of shunt filter legs is tuned to a first resonant frequency that is less than the center frequency but is (1/1.220) times the center frequency or greater, wherein the plurality of shunt filter legs includes second leg that is tuned to a second resonant frequency that is greater than the center frequency but is 1.220 times the center frequency or less.

2. The RF amplifier of claim 1, wherein the resonant frequencies of each of the plurality of shunt filter legs are in an order from lowest to highest resonant frequency, wherein the resonant frequency of each leg is uniformly logarithmically spaced from adjacent resonant frequencies of the order.

3. The RF amplifier of claim 2, wherein the resonant frequency of each leg is uniformly logarithmically spaced from adjacent resonant frequencies of the order by a spacing factor that is less than or equal to 0.4 and greater than zero.

4. The RF amplifier of claim 1, wherein
   the suppressing frequency range has a center frequency (CF), a low frequency end, and a high frequency end, wherein the low frequency end is greater than or equal to (1/1.4)CF and the high frequency end is less than or equal to 1.4 CF.

5. The RF amplifier of claim 1, wherein the suppressing frequency range is for a second harmonic of a carrier frequency in a range of carrier frequencies.

6. The RF amplifier of claim 1, wherein the harmonic filter provides at least −20 db of rejection across the suppression range in a 50 ohm measurement system.

7. The RF amplifier of claim 1, wherein the harmonic filter is implemented in a substrate, wherein the set of at least one resistive element is implemented in a polysilicon structure.

8. The RF amplifier of claim 7, wherein the harmonic filter is implemented in a substrate, wherein the inductors and input are implemented as metal structures of the substrate.

9. The RF amplifier of claim 1, wherein each resistive element is within a range from 10 ohms to 10K ohms.

10. The RF amplifier of claim 1 wherein the range of suppression frequencies is within a range of 100 MHz to 10000 MHz.

11. The RF amplifier of claim 1, wherein the plurality of shunt filter legs includes a number of shunt filter legs in the range of 3-9.

12. The RF amplifier of claim 1, wherein for each shunt filter leg of the plurality of shunt filter legs, the inductor is located between the input and the capacitor.

13. The RF amplifier of claim 1, wherein the plurality of resonant frequencies are each located in the suppressing frequency range.

14. A method of operating an RF amplifier, comprising:
providing an input signal to the RF amplifier, the input signal including a carrier frequency;
suppressing a harmonic of the carrier frequency with a filter, the filter including a plurality of shunt legs located in parallel and coupled to a power supply terminal, wherein each shunt leg of the plurality includes a capacitor and an inductor located in series with a node located between the capacitor and the inductor, each shunt leg of the plurality is tuned to a resonant frequency of a plurality of resonant frequencies, wherein the filter provides a suppression range, wherein a first leg of the plurality of shunt legs is tuned to a first resonant frequency of the plurality of resonant frequencies that is less than a center frequency (CF) of the suppression range and greater than or equal to (1/1.220) times the center frequency, wherein a second leg of the plurality is tuned to a second resonant frequency of the plurality of resonant frequencies that is greater than the center frequency and is less than or equal to 1.220 times the center frequency, wherein the filter includes a set of at least one resistive element, each resistive element of the set is coupled between the nodes of two different shunt filter legs of the plurality of shunt filter legs to provide a resistive path between the nodes of the two different shunt filter legs;
amplifying the input signal with a transistor device.

15. The method of claim 14, wherein the resonant frequencies of each of the plurality of shunt filter legs are in an order from lowest to highest resonant frequency, wherein the resonant frequency of each leg is uniformly logarithmically spaced from adjacent resonant frequencies of the order.

16. The method of claim 15, wherein the resonant frequency of each leg is uniformly logarithmically spaced from adjacent resonant frequencies of the order by a spacing factor that is less than or equal to 0.4 and greater than zero.

17. The method of claim 14, wherein the suppressing frequency range has a center frequency (CF), a low frequency end, and a high frequency end, wherein the low frequency end is greater than or equal to (1/1.4)CF and the high frequency end is less than or equal to 1.4 CF.

18. The method of claim 14, wherein the suppressing frequency range is for a second harmonic of a carrier frequency in a range of carrier frequencies.

19. The RF amplifier of claim 14, wherein the harmonic filter provides at least −20 db of rejection across the suppression range in a 50 ohm measurement system.

20. The RF amplifier of claim 14, wherein the plurality of shunt filter legs includes a number of shunt filter legs in the range of 3-9.

* * * * *